US008950900B2

(12) United States Patent
Stuart (10) Patent No.: US 8,950,900 B2
(45) Date of Patent: *Feb. 10, 2015

(54) LASER ENERGY SOURCE DEVICE (71) Applicant: Martin A. Stuart, Burbank, CA (US)

(72) Inventor: Martin A. Stuart, Burbank, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/893,070

(22) Filed: May 13, 2013

(65) Prior Publication Data

US 2014/0355146 A1    Dec. 4, 2014

Related U.S. Application Data (63) Continuation-in-part of application No. 13/478,605, filed on May 23, 2012, now Pat. No. 8,439,523, which is a continuation of application No. 12/763,437, filed on Apr. 20, 2010, now Pat. No. 8,220,965, which is a continuation of application No. PCT/US2008/081137, filed on Oct. 24, 2008.

(60) Provisional application No. 61/000,228, filed on Oct. 25, 2007.

(51) Int. Cl.
G02B 27/20     (2006.01)
H01S 5/00      (2006.01)
H01S 5/065     (2006.01)
G02B 19/00     (2006.01)

(52) U.S. Cl.
CPC ............ *H01S 5/0071* (2013.01); *H01S 5/0656* (2013.01); *G02B 19/0023* (2013.01); *G02B 19/0052* (2013.01); *G02B 19/0057* (2013.01)

USPC ........... 362/259; 362/553; 362/268; 362/278; 362/297; 362/300

(58) Field of Classification Search
USPC ............ 362/259, 553, 268, 278, 296.01, 297, 362/298, 300
See application file for complete search history.

(56) References Cited

U.S. PATENT DOCUMENTS 25,421 A    9/1859  Knapp
3,407,294 A   3/1966  Hill
(Continued)

FOREIGN PATENT DOCUMENTS

JP        8204275 A        8/1996
WO    WO2006122110 A2    11/2006
WO    WO2009055687 A2    4/2009

OTHER PUBLICATIONS

PCT International Search Report; International Application No. PCT/US2008/081137; Applicant Reference: STUT-44448WO; International Filing Date: Oct. 24, 2009; Applicant: Martin A. Stuart; Date of Actual Completion of International Search: Jul. 3, 2009; Date of Mailing of International Search Report: Jul. 6, 2009.

*Primary Examiner* — Ismael Negron
(74) *Attorney, Agent, or Firm* — Pearne & Gordon LLP (57) ABSTRACT A device and method for providing a laser system utilizing high efficiency lasers emitters and optionally the high quality beam characteristics of a crystal gain medium single mode laser for emitting beamlets and utilizing an optical and mechanical method of forming the beam and directing it to the desired target using both a concave and a partially reflective convex mirror to reflect the beamlets, with the convex mirror transmitting a portion of the beamlets to a transmission medium for emitting the beamlets as a laser beam.

21 Claims, 8 Drawing Sheets

(56) References Cited

U.S. PATENT DOCUMENTS

| | | |
|---|---|---|
| 3,518,419 A | 6/1970 | Humphrey |
| 3,541,323 A | 11/1970 | Davis et al. |
| 3,619,588 A | 11/1971 | Chambers |
| 3,796,886 A | 3/1974 | Freeman |
| 4,589,738 A | 5/1986 | Ozaki |
| 5,655,832 A | 8/1997 | Pelka et al. |
| 6,782,016 B2 | 8/2004 | Braiman et al. |
| 6,782,069 B1 | 8/2004 | Kang et al. |
| 6,813,069 B2 | 11/2004 | Rice et al. |
| 6,826,224 B2 | 11/2004 | Yuri et al. |
| 6,828,224 B2 | 12/2004 | Iijima et al. |
| 6,963,678 B2 | 11/2005 | Werkheiser et al. |
| 7,055,991 B2 | 6/2006 | Lin |
| 7,203,210 B2 | 4/2007 | Sox et al. |
| 7,212,553 B2 | 5/2007 | Staroudoumov et al. |
| 8,220,965 B2 * | 7/2012 | Stuart ............ 362/259 |
| 8,439,523 B2 * | 5/2013 | Stuart ............ 362/259 |
| 2003/0147255 A1 | 8/2003 | Im |
| 2005/0030986 A1 | 2/2005 | Farrell et al. |

\* cited by examiner

LASER ENERGY SOURCE DEVICE

CROSS-REFERENCES TO RELATED APPLICATIONS

This application is a continuation-in-part of U.S. Pat. No. 8,439,523 filed on May 23, 2012, which is a continuation of U.S. Pat. No. 8,220,965 that was filed on Apr. 20, 2010, that was a continuation of PCT application serial number PCT/US08/81137 filed on Oct. 24, 2008, and which claims the benefit of U.S. provisional application Ser. No. 61/000,228, filed on Oct. 25, 2007, all incorporated herein by reference.

BACKGROUND OF THE INVENTION

Lasers have various applications. The determination of any particular application is dependent on both the power and the beam characteristics. Pulse length, energy per pulse, polarization, and coherence length all play a part in the final outcome of the chosen application. Although there are many different types of lasers, as well as many different applications, of particular usefulness for many applications are diode lasers.

Diode lasers have high electrical efficiency and can be set up in an array pattern which can then be scaled to produce a high power. In the past, when such an arrangement was attempted, each emitter (usually 1 of 50 per cm bar, put into a stack) has produced a beam with a separate, differing wavelength (i.e.: color), coherence length, and divergence per emitter.

Laser diode power modules are known to change their peak output frequency with temperature variants, which naturally occur in arrays of laser diodes, typically at a rate of 0.3 nanometers per degree C. This often causes the entire array to operate at different frequencies from the point of turn-on until they have reached overload, with potentially negative results.

Across each emitter bar there is typically a temperature difference from edge to center to opposite edge as electrical power is directed to the device and water is utilized in the prior art in an attempt to remove the temperature differentials. This results in a corresponding color output difference in commercially available diode laser stacks or modules. The effect means that as one attempts to focus this light to a point, each emitter will focus to a different point or at a different distance from the lens. This can be a particular problem if the laser is to be focused miles, hundreds of miles, or thousands of miles away.

Due to these factors, the quest to produce a simple device utilizing these diode lasers producing a useful, single output beam has, to date, eluded the scientific and technology worlds. Other methods have been tried and have had success in this goal. This has limited the usefulness of diode lasers for a number of useful applications, including high-power applications. The prior art diode lasers have not produced a useful, simple to implement, single output beam device, and such a result has eluded the scientific and technology worlds. It would be useful to provide a device that overcomes one or more of these problems.

Various prior art methods of collating the outputs of laser emitters have been used with various levels of success, and all with substantial shortcomings. U.S. Pat. No. 6,782,016, incorporated by reference, discloses injection synchronizing a plurality of pulsed broad area lasers using a signal source; modulating the plurality of pulsed broad area lasers using the signal source; and externally coupling the plurality of pulsed broad area lasers. U.S. Pat. No. 6,813,069, incorporated by reference, discloses a refractive index matched MOPA scaled fiber array laser. U.S. Pat. No. 6,826,224, incorporated by reference, shows a high power semiconductor array that outputs wavelength matched, phase matched light which uses leakage between individual emitters next to each other in a bar. U.S. Pat. No. 7,203,210, incorporated by reference, uses a liquid crystal light valve on each diode emitter. U.S. Pat. No. 7,212,553, incorporated by reference, uses feedback to frequency lock the diode laser to 1 nanometer bandwidth, for a fiber laser array. But none of these solutions are adequate for all current needs.

SUMMARY OF THE INVENTION

Provided are a plurality of embodiments the invention, including, but not limited to, a convenient, new optically and mechanically innovative method of making a laser system with the high efficiency of diode lasers and the high quality beam characteristics of crystal gain medium single mode laser.

Also provided is a suggested design that would allow for a forty percent or higher on target delivery of electrical to light energy for military applications that is robust and cheap to operate.

Still further provided is a suggested enabling technology to provide for deep sea or land high-speed drilling and tunneling system capable of accessing the oil reserves in the deeper section of the Gulf of Mexico. The device is compact enough to be lowered into position on a robotically operated vehicle, in sea applications, or the energy can be fed into a suitable fiber delivery system, for example.

Accordingly is provided a device for generating a focused laser beam, with the device comprising: a plurality of laser diodes formed into an array, each of the diode lasers for emitting a laser beamlet operated to produce a plurality of beamlets; a first concave reflecting mirror for converging the beamlets to a focal point; an integrating convex mirror placed at or near the focal point, the integrated mirror adapted for reflecting a first portion of the beamlets back toward the first reflecting mirror and for allowing a second portion of the beamlets through the integrating mirror; and a light transmitter adapted for transmitting the second portion of the beamlets from the integrating mirror, wherein the second portion of beamlets exit the light transmitter as a homogenized uniform laser beam having substantially uniform convergence and focus.

Further provided is the above device further comprising a beam director subsystem including: a focusing mirror for receiving the homogenized uniform laser beam to reflect a divergent laser beam; and a second concave reflecting mirror for receiving the divergent laser beam for reflection toward a target.

Also provided is the above device wherein the focusing mirror is a deformable convex focusing mirror and wherein the device further comprises a controller for controlling a deformation of the deformable convex focusing mirror.

Still further provided is a method of directing a laser beam to a target, with the method comprising the steps of:
  generating a plurality of originating beamlets using a plurality of individual beam generators;
  reflecting a first portion of the beamlets back toward the originating beamlets in a manner such that the first portion of beamlets overlap the originating beamlets to frequency lock the dominant gain profile of the generators and lock the coherence length of the beamlets to the dominant phase profile; and focusing and directing a second portion of the beamlets that are locked in frequency and coherence as the laser beam toward the target.

Also provided is the above method further comprising the step of diverging and further focusing the laser beam prior to directing the laser beam toward the target.

Further provided is a device for generating a focused laser beam, said device comprising: an emitter arranged to produce a plurality of beamlets; a first concave reflecting mirror for converging said beamlets to a focal point; an integrating convex mirror placed at or near said focal point, said integrated convex mirror adapted for reflecting a first portion of said beamlets back toward said first reflecting mirror and for allowing a second portion of said beamlets through said integrating convex mirror; and a light transmitter adapted for transmitting said second portion of said beamlets from said integrating convex mirror, wherein said second portion of beamlets exit said light transmitter as a laser beam.

Also provided are additional embodiments of the invention, some, but not all of which, are described hereinbelow in more detail.

BRIEF DESCRIPTION OF THE DRAWINGS

The features and advantages of the examples of the present invention described herein will become apparent to those skilled in the art to which the present invention relates upon reading the following description, with reference to the accompanying drawings, in which.

DETAILED DESCRIPTION OF THE EXAMPLE EMBODIMENTS

This application describes various embodiments of a device (or system of devices/components) and a method that can allow power scaling to just about any level desired, from lower power applications to high-power applications, for arrays of various laser emitters. In particular is disclosed an Integrating Feedback Mirror (IFM) system for focusing and aligning laser beams (beamlets) The beam(s) provided by use of these devices/methods may be of a single wavelength and coherence length, which makes it very useful and adaptable.

A number of emitter and/or different gain materials can be used effectively with this IFM system. One example emitter is based on diode laser gain materials. The operating principle of this system is that any optically active gain system within the diameter of the main mirror and its expanded and collimated injection seed laser beam, will be integrated into a more controlled beam output system with a line narrowed output, after passing through a frequency appropriate amplifier gain medium. An injected seed laser with defined characteristics will narrow the line width to the degree that the seed injected laser beam is line narrowed. This is particularly true for continuous wave diode laser sources.

For Pulsed output operation, the seed laser can also define that characteristic within the bandwidth of the gain material. In the case of very short pulse operation as in nano second long pulses, the designer should include the optical path length of each amplifier chain so that they can be equalized with adjacent chains.

For sub-nanosecond duration pulses, the designer should include elements that will adjust this parameter to finer levels of precision as the individual pulse gets shorter. Also for sub-nanosecond pulses, specifically where the desired pulses are intended to be compressed as in ultra-fast operation, the amplifier chain should include dispersion compensating elements as the dispersion of the gain material with the amplifier element and chain path length will be different for the more dispersed frequency, in which case the amplifier chain will include these compensation elements in the overall design.

However, the expanded IFM system will inject and combine the amplified beamlets in a patchwork fashion as individual beamlets, without interference with each other at long distances, provided the beamlets are still coherent with each other. If the designer has not included the phase control elements for this feature, then the beamlets will not interfere with each other until they are focused to a point or the diffraction limit blooms them into each other at a specific distance. This aspect is not influenced by the IFM directly; however it will reduce the workload of those elements should they be included.

For a first example embodiment of an IFM system, diode laser power bars can be utilized. Such diode bars are high-power semiconductor lasers (laser diodes), containing a one-dimensional array of broad-area emitters. They typically contain between 20 and 50 emitters, each being e.g. 100 µm wide. The diode laser power bars are then fabricated into stacked arrays, such as, for the purpose of illustration, 2 cm wide×a chosen length, but other dimensions can be used where appropriate for the given application. For the purposes of an example used in this application, a fabricated size of 2 cm wide×5 cm high with 20 bars mounted within the housing can be used.

Once the size of the power bar array has been designated, the array or arrays are then mounted onto a structural support in such a way that all of the arrays are parallel.

Once mounted, the array will be fitted with lenses in order to collimate both the X and Y (or fast and slow) axes of each beam in the array. This causes the beams to be projected in what are nearly parallel "beamlets" which are perpendicular to the power bar array.

At a designated distance in front of the beam array a concave, high reflecting mirror is placed. The mirror is constructed with a focal length such that the focal point is on the plane of the power bar array.

Intercepting the return beam coming from the concave integration mirror is a convex optical mirror which is at least partially reflective. The convex surface of this integration mirror ultimately reflects a portion of the beamlets from all of the converging array of beamlets back to the original power beam array. The curve of the integration mirror is chosen so that the resulting reflection beam is larger than what was sent out as the originating emitted beamlets. The returning (reflected) beams or array of beamlets is large enough to overlap the other emitters on the diode laser array" and the adjacent modules in the array. This integration mirror is designed as a partially reflecting, integrating feedback mirror. The reflectivity of this feedback mirror is determined by the gain characteristics of the chosen lasers (diode or fiber). The output frequency desired will determine the materials used in the diodes of the laser array. As other parts of the spectrum are chosen, such as eye safe high water absorption lines, the gain is lower for these devices so a higher reflectivity is required.

When each "beamlet" emitter can "see" (interact with) the other emitters, the entire array becomes frequency locked to the dominant gain profile of the arrays, and the coherence length is also locked to the dominant phase profile of the array. If the implementor wishes to produce a particularly line narrowed beam, a seed laser utilizing a Littman-Metcalf extended cavity diode laser (ECDL), operating in the same part of the spectrum as the main diode array, can be employed. This configuration is called a master oscillator power amplifier or MOPA configuration. This ECDL would have its seed beam directed into a module at a convenient location, such as near the perimeter of the array. This module would be the first to be turned on in the array, and the adjacent modules would also sequentially be turned on or energized in the array a few microseconds apart. This would proceed at turn-on until the entire array had been activated.

In the event that an implementor wished to amplify a very short pulse, such as a pulse that had a duration of one picosecond (corresponding to an optical path length of 0.3048 mm) or less, the seed pulse would be directed towards the integrating feedback mirror so as to irradiate the array at the same time. In this configuration the distance to the feedback mirror would be made the same by mounting the modules on stepped platforms in the array so as to be at the same radius from the feedback mirror. This effect would take place also by using a longer mirror to array distance.

The remaining converging beam that is not reflected passes through the integration mirror and then can be directed into one or more light transport conduits (e.g., fiber optics, a waveguide, or collimating optics). The chosen conduit is run through the center of the array. This constitutes the output of the array as each of the beamlets has been both frequency and phase locked to each other.

A separate beam director system can be mounted adjacent to the emitter structural support system, in which case a compact, very high power laser device is realized. The beam director, which is made up of both the beam expanding optical elements and the refocusing optical elements, allows the output optical energy to be focused at the desired distance onto a desired target.

The device as shown in the example embodiments includes a feedback optical element that couples a sufficient amount of laser energy into surrounding laser emitters, causing a chain reaction effect. Because ultimately all of the emitters are coupled together by the design of the device, this effect can be used for a device utilizing any size array that the designer and/or implementor would choose to construct.

The spectral output from a single diode laser emitter that could be utilized for practical use might be about 2-3 nanometers wide or about 10 gigahertz, in a bell shaped output curve. Within that bell curve are closely spaced spikes with about 150 megahertz separation. An extended cavity diode laser (ECDL) would use a diode laser emitter, similar to a laser pointer but more powerful, which bounces the beam off a diffraction grating at an oblique angle, a common configuration is called a Littman-Metcalf resonator. These devices emit with a line-width of 120 kilohertz or less.

The line-width from a ECDL is less than the spike or mode spacing of 150 megahertz, thus if a whole array was encouraged into making only that narrow line-width, the laser could be focused to the smallest possible spot at the farthest possible distance. Examples include about three miles near the ocean (haze), 6-8 miles in the dessert (dust), 160 miles at about ten thousand feet altitude or even at a range of 2,000 miles or more from outer space.

Lasers have a gain of a certain amount per centimeter of gain material. Diode lasers operating in the near infrared part of the spectrum typically have a gain of about 3,000 per centimeter, with power bars being usually 0.10-0.15 cm. width, but because such devices have a rear mirror, a photon entering the "front" will pass through the gain section twice before leaving the diode laser.

The designs provided in the example embodiments can be narrowed to the 2-3 nm bandwidth. The ECDL is utilized as a seed laser, within the 20 milliwatt (up to several watts or more) seed beam being reflected into a first module, where the output from this first stack will be line narrowed. A main mirror reflection will be directed onto a feedback mirror (which is a lens that can be made with a dielectric coating to a specific reflectivity or of uncoated glass or clear sapphire @ 4.5% & 10% reflection, respectively, for example, though diamond is also an option at about 20% reflection, and can handle very high power levels due to high thermal conductivity). The backward reflecting beam then spreads or diverges onto a larger part of the array.

After several bounces of the beams (beamlets), the whole array becomes frequency locked to the 120 kilohertz output of the ECDL seed laser. This is referred to as Master Oscillator Power Amplifier or MOPA type configuration.

As an alternative approach discussed in more detail below, an array of fiber lasers could be utilized instead of the diode emitters, if a feedback mirror concept with a seed laser is used as an option. The fiber lasers act like the diode lasers in the MOPA example. Where in this example the line-width will be narrowed and the array would be substantially coherent and single mode in operation (each of those spikes competes with each other to grab as much energy as possible in the gain medium, whether diode or fiber). A problem might arise where fiber lasers are out of phase with each other (i.e., in multi-mode output). When this happens, the beam could be focused to a spot that is several times the diameter of a diffraction limited spot, with a resulting lower beam intensity.

Thus, the design of the example embodiment allows the diode array to continue to couple an output that is both frequency locked and phase locked, and therefore not temperature dependant, which can avoid the temperature-frequency drift or instability problem of the prior art.

Figure 1:
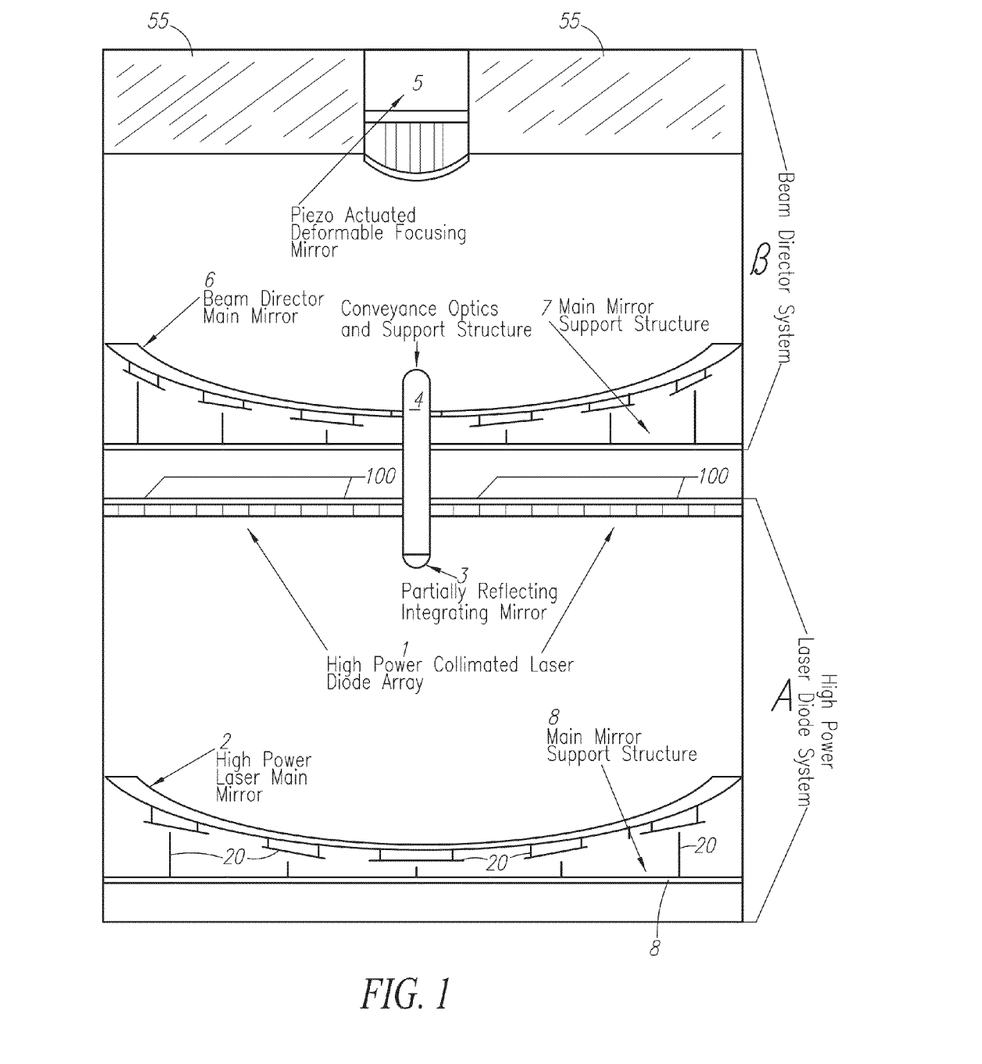
FIG. 1 illustrates the system components forming the apparatus of the present invention.
Figure 2:
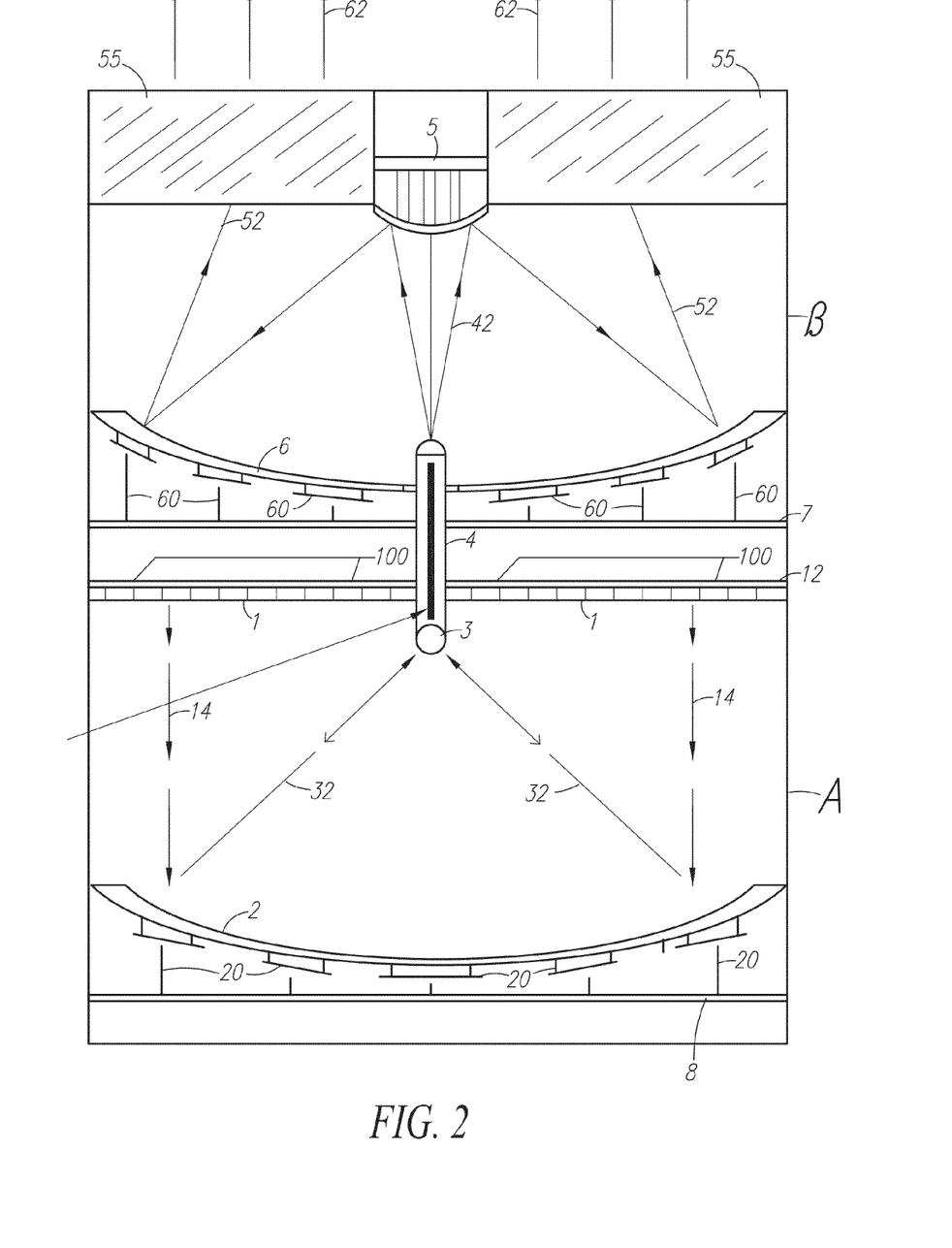
FIG. 2 illustrates the method of operation of the system components including additional support equipment.

FIGS. 1 and 2 show various features of the example embodiment shown in two parts, a laser system A and a beam focusing system B. Commercially available collimated continuous wave or pulsed laser diode modules 1 are provided in the center of the structure. In the example, a 2 cm wide by 3.5 cm high micro-channel cooled array is chosen to be attached to a structural support plate 12 constructed of stainless steel. This allows the cooling and electrical connections to be made from the rear of each diode array module as shown in FIG. 2. The divergence of these modules can typically be reduced to 4°.

The high power laser main mirror 2 is located to receive laser energy "beamlets" 14 from the diode array. The main mirror 2 can utilize a standard diameter with a custom curve, diamond turned ceramic or metal plate made from a thermally invariant ceramic or thermally stable alloy such as beryllium. This ceramic plate is finished with a 99.9% dielectric coating which is the high reflecting surface. This main mirror is then supported in the device with an appropriate support structures 8, 20.

One purpose of the main mirror 2 is to converge the beamlets 14 from the array onto the partially reflecting integrating mirror 3. The ceramic or metal alloy plate is chosen due to its ability to maintain its shape over a span of large temperature changes. Although commercially available materials can be utilized to construct this mirror, the specific shape of the main mirror 2 is chosen in order to converge the beamlets 14, such as in the manner described in this disclosure.

The partially reflecting integrating mirror 3 receives the reflected beamlets 32. The convex optic of the integrating mirror 3 is designed to reflect at least a part (one to fifty %) of the light of the beamlets 32 back toward the high power laser diode array modules 1, and to transmit the remaining beamlets through the integrating mirror 3 to a light transmitter (waveguide).

The gain of each laser diode emitter 100 for the example embodiment is about 3000/cm-1 for near infrared devices. If small amounts of energy from an adjacent emitter are coupled into another emitter, then both emitters will become frequency locked and phase locked to each other, an effect that is utilized by the invention. The conveyance optics could use either a hollow waveguide, or a large mode area fiber optic, as a light transmitter 4 to transmit the laser light from laser chamber A to beam director chamber B. The light transmitter 4 is supported in the device with an appropriate support structure.

The purpose of this optic design is to homogenize all of the beamlets 32 into a single, uniform beam 42 with uniform divergence characteristics. The light transmitter, coupled with the partially reflection integrating mirror 3, produces the final beam characteristics allowing the beam director to transmit and focus the output from the array 1 at a predictable distance.

Several different technologies can be utilized for the light transmitter 4. If the transmitter 4 is just a hollow conduit, then the output will consist of individual beamlets passing next to each other, and thus will act exactly like each other as the subsequent system refocuses the beam (which might include adaptive optics systems to counter atmospheric distortion, for example), and a subsequent beam director (e.g., a telescope in a turret) to hit an intended target or work piece. There is a minimum diameter to which each beamlet can be focused in a design utilizing a hollow conduit, which leads to the use of a light conduit for additional beam conditioning by homogenizing the beamlets into one beam which has consistent and predictable behavior.

Using a light conduit as the transmitter 4 can homogenize the beamlets into a monolithic beam, as long as the thermal distortions in the conduit are dealt with. Liquid filled conduits can be utilized as the transmitter 4, but as the liquid gets hot, the liquid changes its density and its refractive index, and that should be compensated for. This might be done by utilizing pumped deionized water (as long as a non water absorbing color of light is used).

Still another option would be to direct each beam-let into an individual fiber for feeding the beamlet's energy to a distant beam director without having to deal with the finicky vibration sensitive optics of tube and telescope designs as part of the device.

Alternatively, a light conduit made of a rod of glass which has been made into a giant gradient index fiber optic by putting it into a bath of silver nitrate to change its refractive index across the diameter could be utilized for the light transmitter 4. This design would be an effective beam homogenizer that could handle large power levels as well. Another method of producing a gradient index optic would be to fabricate concentric tubes of glass with increasing refractive indexes then fusing them into a single solid. This is the current method of producing a fiber optic perform, which is the stage just before heating and stretching to make fibers.

A beam director system B is provided to direct the resulting laser beam provided by the laser system A. A piezoelectric deformable convex focusing mirror 5 could be provided by a commercially available system component with a shape dependent on the system constraints. This type of focusing mirror 5 can change its curve or effective focal length by up to 2 diopters or more. This will cause the uniform beam 42 output from the light transmitter 4 to diverge into a laser beam 52. An output dust window 55 can be provided for the beam director. In a weapon system, this would preferably be a piece of bullet proof sapphire or segments of sapphire.

Acting in conjunction with a beam director mirror 6, these two optics basically form a confocal telescope focusing system to produce a high power output laser beam 62.

The beam director mirror 6 can be made physically identical to the high power laser main mirror 2, or modifications might be provided for particular desired characteristics. In the example embodiment of FIGS. 1-2, this beam director mirror 6 is used to project the high power beam output onto the desired target.

The main mirror support structures 8, 20 and 7, 60 can use a plurality of press plates with proven 3-point contacts provided per press plate formula in its construction. A uniform pressure from multiple press plates clamps the main mirrors into their respective frames while allowing shock absorption and thermal venting from the back side of each optic. The main mirror support structure can be mechanical or pneumatic to meet system requirements chosen by the implementor. One would be more suitable for a stationary application and the other for a high stress environment.

An external cooling system and electrical and control system connections can be provided for the device, for example at location 100, for supporting the diode array 1. The cooling system can utilize deionized water under pressure to cool the diodes. Such a system could utilize a plurality of redundant water jet pumps throttled back by bypass regulators. Such a system can utilize off-the-shelf components that are tailored to function in land, sea, or air configurations, as desired.

The external power supply and control system is also coupled to the diode array. This could utilize a commercially available device that has been custom specified for the present invention. Such devices are normally made to military specifications, and are made up of high temperature rugidized and attack hardened components. These are controlled by the "On-Off" commands of an external control system, such as a targeting radar and computer system provided in a military application. Such a system would normally be available for purchase by authorized government personnel when integrating such systems. When combined with the diode system, this control system controls the targeting and fire control output of the integrated device by sending the finalized focusing information onto a focusing control system computer 400.

The adaptive optics including the focusing mirror 5 is under the control of the main control system, and can change the focal distance of the beam director. This allows the spot size to automatically custom focus to the specified distance at which the laser operator or targeting control computer has chosen for its workpiece or target The present invention is not only enabled by the coupling design, but is also able to improve the output performance of a standard diode power module by use of the waveguide (or large mode area fiber) as will be described hereinbelow. This component makes the entire beam predictable for the computer-aided design of the beam director.

Figure 3:
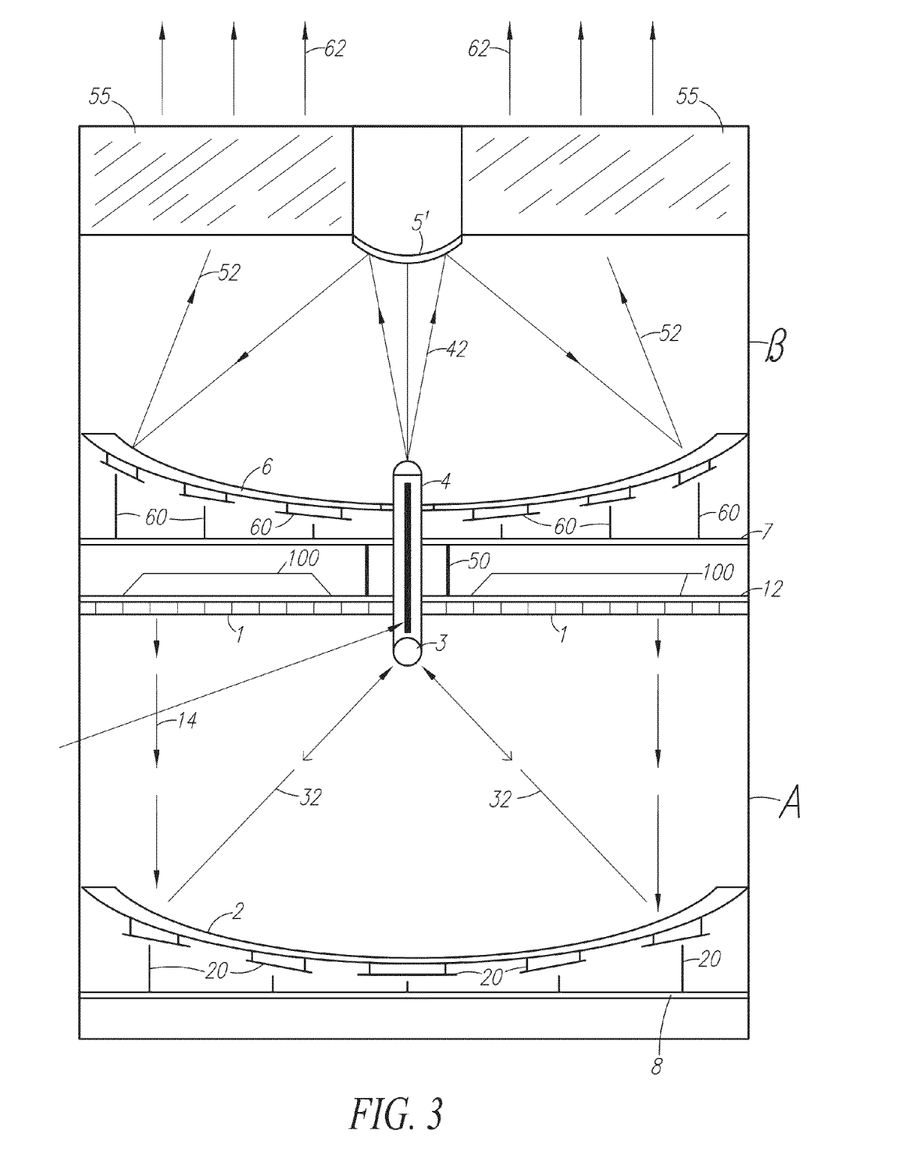
FIG. 3 illustrates another embodiment of the system components.

Another embodiment, shown by FIG. 3, provides an alternative adaptive optics system 50 configuration, using a fixed convex mirror 5'.

Conceptually, this system 50 includes four mirrors. A beam is transmitted straight up from the conduit, after being made parallel by a lens. Picture the first mirror at a 45 degree angle sending the beam to the right. Now have two identical mirrors that have a short focal point facing each other with the focal point common to both so that the light shines into the first curved mirror and sends the light into the second curved mirror. Let's say that the two curved mirrors are sending the light vertically with the light from the second curved mirror directing the light left onto the fourth mirror which sends the light again vertically.

The focal point from the first curved mirror is made shorter, then the light coming out of the second curved mirror would become convergent if nothing changed in the second mirror. Now picture the 45 degree bending mirrors being dichroic, so that they are high reflectors at the laser wavelength but transparent to other parts of the spectrum. Looking through the first mirror at the first curved mirror, a camera system would see the same thing that the beam director was looking at. If the second bending mirror is made of sapphire, it would be transparent to the mid infrared spectrum, say 1-5 u.

Figure 4:
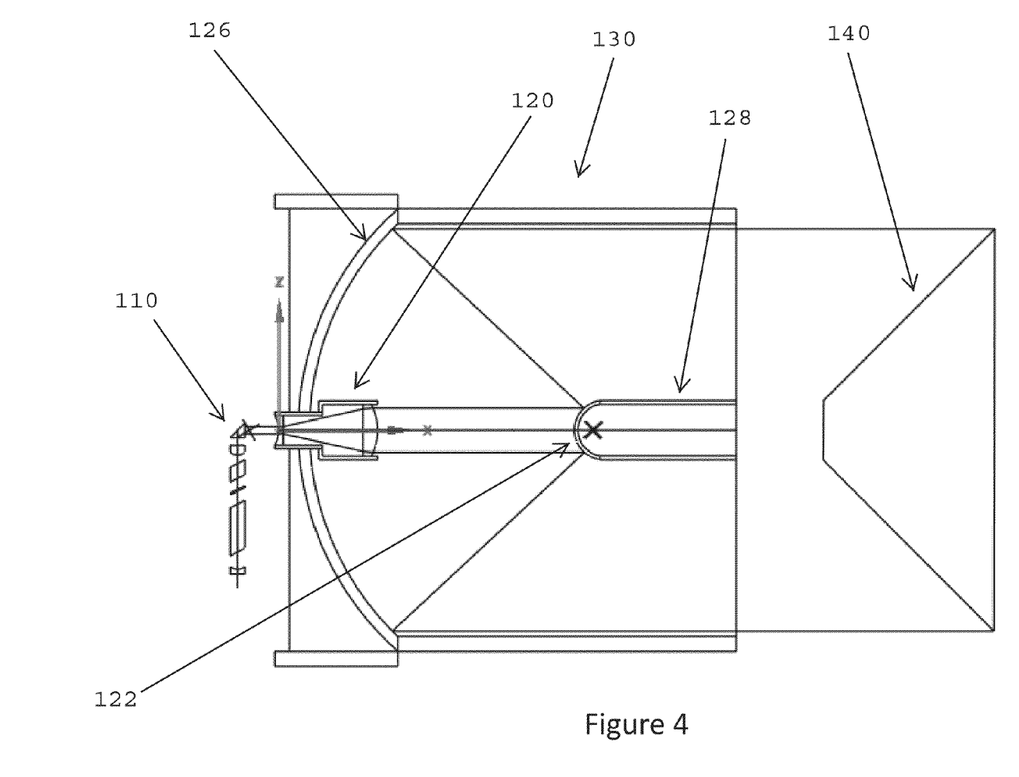
FIG. 4 illustrates an alternative example architecture employing a general method to support multiplexing additional alternative configurations.

FIG. 4 illustrates an alternative example architecture employing a general method to multiplex awkward configurations using alternative emitter materials, such as fiber bundles or multiple slab amplifier chains that would be more compact, for systems that could be scaled to hundreds of megawatts of output power levels. In this modification, an integrating feedback mirror system 130 which might use a beam focusing system utilizing many of the components substantially as provided by the systems shown in FIGS. 1-3 (including a concave focusing mirror 126 and a convex partially reflective integrating mirror 122 and light transmitter 128), using a seed laser collimator 120 with the seed laser 110, with a multiplexing mirror 140 being provided to direct the emitter laser beamlets toward the mirror system 130.

Figure 5:
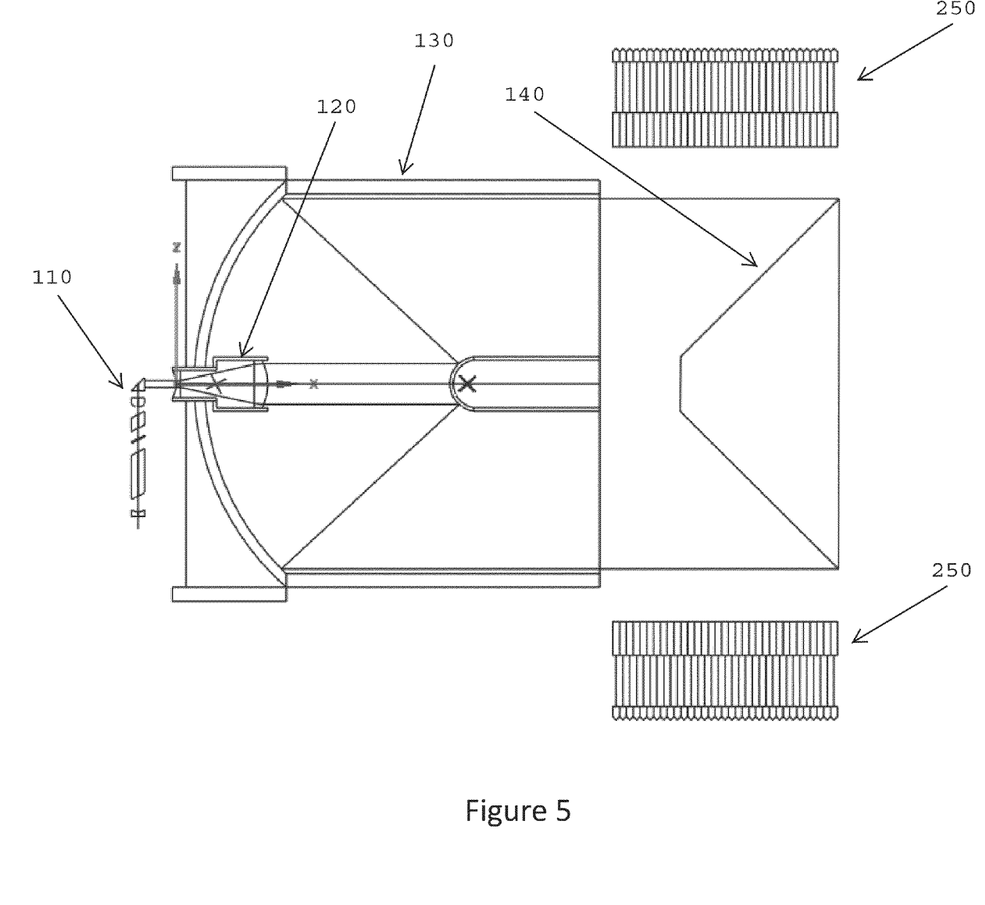
FIG. 5 illustrates an alternative example architecture employing fiber laser amplifiers chains and FIG. 5A is an on-axis view of a fiber input collimator array.
Figure 5A:
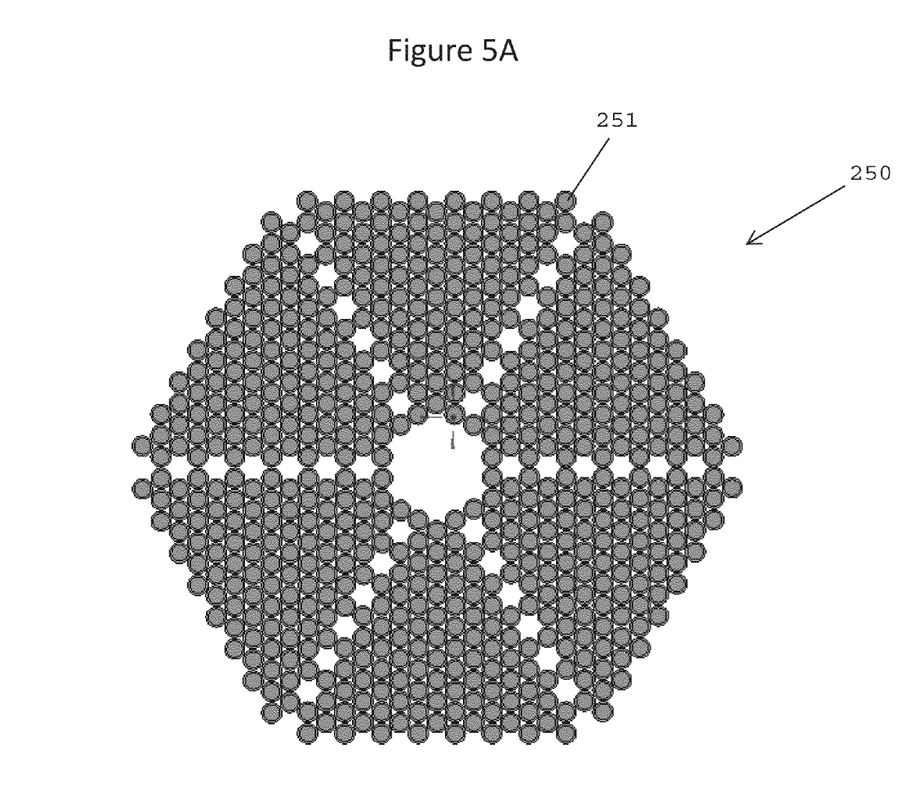

FIG. 5 illustrates an alternative embodiment employing fiber gain medium elements. In this architecture, the input and exit apertures of each fiber 251 of the fiber arrays 250 (see FIG. 5A of the elements 250 showing an on-axis view of a fiber input collimator array) are mounted in collimator lens and or mirror end modules.

In this alternative architecture, the fibers are made of identical length for short pulse operation, but can be of random length for long pulse or continuous operation. The fibers themselves would have no specific polarization orientation for non-phase or coherence length operation, but would for line narrowed polarization required operation.

The non-pulse operation version of this architecture could still be coherence length controlled for a long range application such as in laser weapons or launch system operation. This architecture resembles the diode based system described above in that it would best use a side array entry injection beam from the (master oscillator) seed laser.

Figure 6:
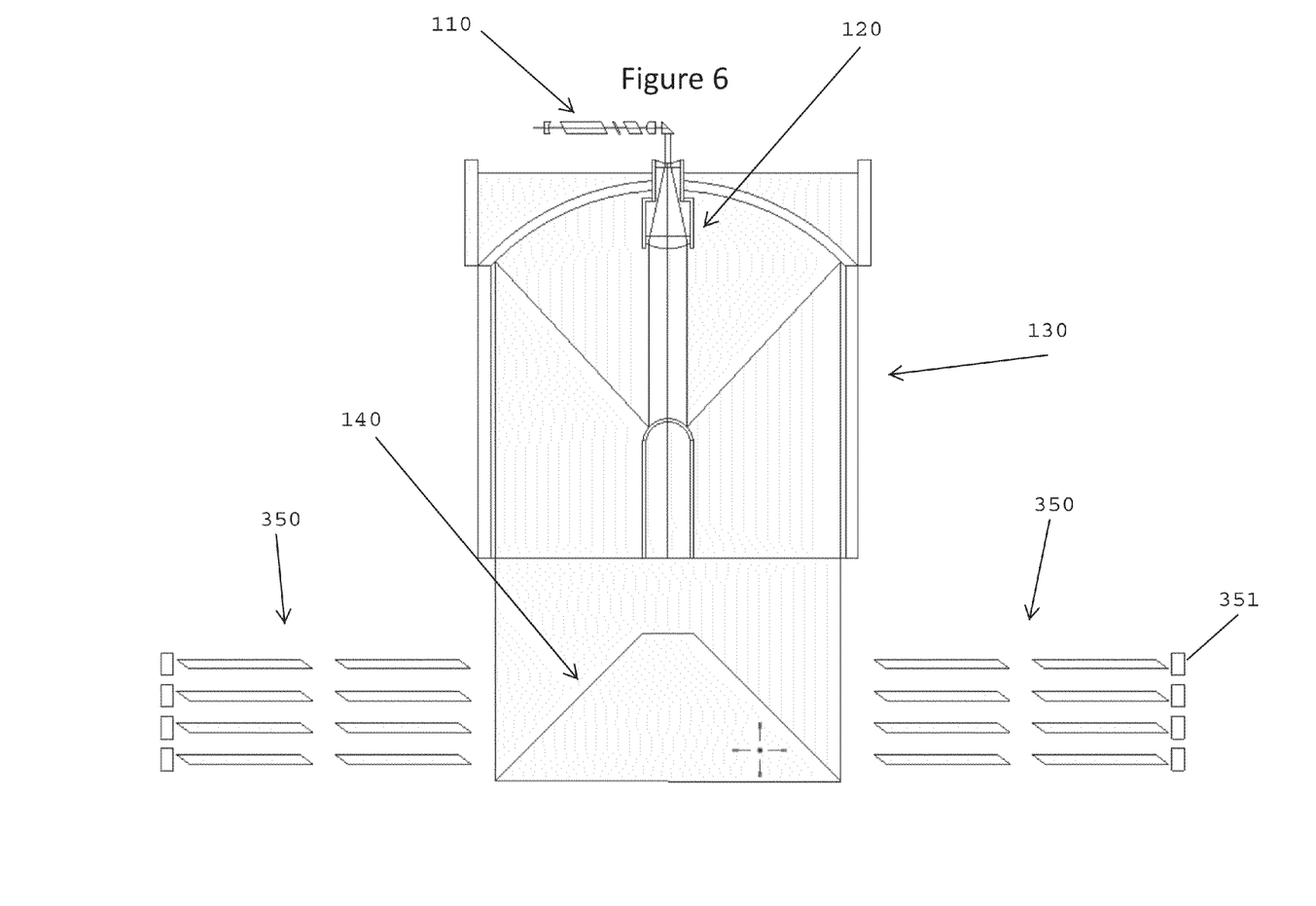
FIG. 6 illustrates an alternative example architecture employing the use of slab laser amplifiers.

Still another example embodiment is provided based on the use of a polarized high average and peak power slab amplifier chain, as shown in FIG. 6. The gain medium 350 can be any lamp pumped or diode laser pumped slab or rod operated gain material, such as might be described in prior art sources. In this example, all individual amplifier beam paths would be made equal. Furthermore they would be such that the polarization of each chain would be parallel to each other and the input seed pulse (which can be accomplished with discrete axially rotated optical elements such as wave plates and or rhomboid prisms used in conjunction with wave plates). This suggested architecture does not need to place the actual gain or amplifier chain within the beam diameter of the main mirror-only the directing beam element such as a mirror or prism. In this architecture, the IFM could be mounted at a different angle to the norm, than the amplifier chains.

By this approach, the accumulated output of the amplifiers (slabs 351) can be synchronized and added, especially in the amplification of short pulses. This would be particularly illustrated by placing the seed laser or master oscillator output, entering the system at the center of the main mirror and being collimated to be the diameter of the actual feedback mirror element. This would be such that the partially reflected seed pulse illuminated the main mirror at the same time, thus the feedback mirror and main mirror must be confocal. The center diameter of the main mirror that is the same diameter as the feedback mirror, is essentially an optically obscured and hence dead zone, so no significant power is lost by this placement. However should this location be the entry point for the subsequent seed pulse, it would propagate through the amplifier chains with one very useful aspect—the end of the amplifier chains would have a return mirror (which could be a Stimulated Brillouin Scattering (SBS) reflection mirror for phase and intensity distortion control) placed at the end of the chain such as to redirect the pulse back through the amplifier chain allowing a passive double pass amplification or rather in the case of a specific design with the mentioned slabs as a double pass or quad pass system, thus allowing a doubling of the per pass count. This system architecture has the effect of allowing the highest extraction from each element of the amplifier chain that is possible.

In the specific case of ultra-short pulse amplification, the amplifier chains would have dispersion and pulse recompression elements, at strategic locations to compensate for the dispersion of the gain material and combined beam path length increase.

Figure 7:
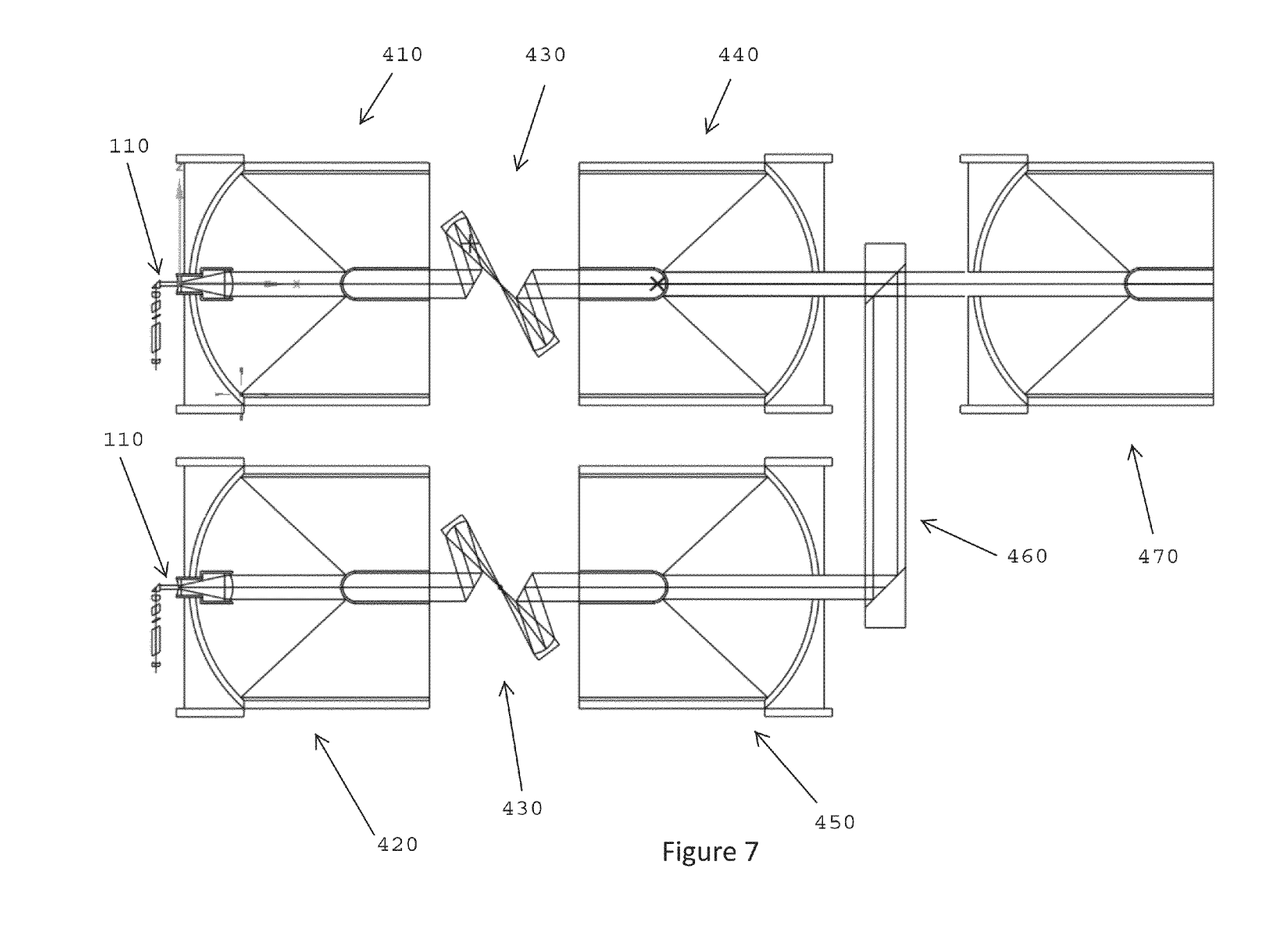
FIG. 7 illustrates an example architecture to combine two Integrating Feedback Mirror (IFM) lasers, one continuous wave and the second pulsed.

The IFM system can be used to facilitate patching a large number of beam sources from diverse devices and operating modes (CW+Pulsed=Hybrid), into a manageable single beam, such as by using the approach shown in FIG. 8, where IFM systems 410, 420 using different approaches (e.g., one continuous wave and the other pulsed), by utilizing adaptive optics 430 and collimators 440, 450, for combining beams in a beam combiner 460 for input into an output beam director 470 for outputting the final laser beam, such as for mining or hard rock excavation.

In extreme cases such as Mountain excavation, laser launch or long range scientific or military applications, a designer could choose to use an adaptive optics system on each amplifier chain and then also slave it to the integrated section of the output beam. In this concept the master and slave adaptive optics systems would act as the single control element of the original adaptive optics system. This is to allow the original concept to be scaled to very high powers.

Following examples will illustrate this. The first is the diode laser gain material exemplified by the diode laser bar module architecture. Others such as a slab laser amplifier chain or fiber bundles (polarized or random) or even several types of gain materials operating at different parts of the spectrum, will work synergistically under the influence of the claimed Integrating Feedback Mirror (IFM) system.

In the situation where random versus polarized emitters are mentioned, this would be the case where high powers were needed but where long range focusing was not a significant issue-such would be the case for thick section welding or close range tunneling operations where the specific need for a closely controlled phase relationship (which would relate to coherence length) was necessary, as in the case where long range focusing was needed for a weapon scientific or a laser based launch system.

System Applications and Examples:

Commercial Applications:

- A 1 kw to 10 kw system would be typical for an application of cutting and/or welding light to medium metals in fabrication manufacturing.
- A 10 kw to 20 kw system would be useful as a bonder for making alloys such as in the case of powdered metal sintering when doing laser engineered net shape part fabrication. This application is mainly used in aerospace manufacturing. This system application could also be used in medium metal plate cutting or welding.
- A 20 kw to 100 kw system would be useful in ship building for heavy/thick section welding or cutting at high rates of speed.
- A 300 kw system is the range that would allow for well drilling and under water welding applications.
- Systems with 1000 kw (1 megawatt) beams would have the capacity to vaporize 1-inch (2.5 cm) diameter holes through approximately 10 feet of rock per second. This would enable tunneling a 50-foot diameter hole through 100 feet of rock in a five hour period of time. (Speed levels would increase in direct proportion with each corresponding 1-megawatt increase).

Telecommunications Systems Applications

An example use for a IFM system is for very high power telecommunications such as ground to space platforms. One suggested architecture, is the use of aircraft and space systems utilizing an edge pumped thin disc active mirror concept for laser amplification, such as provide in U.S. Pat. No. 6,339,605, incorporated herein by reference. This technology can work well with Ytterbium Erbium doped thin glass laser discs as the gain element. This is the same gain material that the telecommunications industry uses but at much lower power levels. If used with the IFM concept, the power output could be scaled to levels permitting direct links through poor weather conditions to earth orbiting satellites. It would also lend itself to satellite to satellite long range systems.

MILITARY APPLICATIONS: As in the commercial applications, the output is again power dependent, although the function in each of the examples given is similar in that they both function as a laser weapon system.

- A 100 kw laser designed with a range of 0.8 to 100 kilometers (0.5 to 160 miles) becomes a dominant force in military applications. Used in this application, the system could be focused onto a target (i.e. a missile, artillery launchers, or any opposing forces) to neutralize it. When directed, the system would cause the beam to vaporize the target or heat sensitive explosives before they could engage.
- A 4-megawatt laser system would be able to destroy approximately 8 targets per second at a range of up to 1600 miles (approximately 2500 kilometers).

Continuous Wave IFM Examples

High speed thick section Welding: A 1 million watt laser can weld 2 inch thick steel plates at a rate of about 50 ft. per minute. Conventional metal wire flux type stick welding is performed at a rate of 1 ft. per day by manual means. This is 2000 times faster. This would be particularly significant for Ship building, Pressure vessel fabrication, bridge framework, utility water delivery pipe or large engineering project assembly.

High speed in place localized heat treating: The above mentioned weld can be performed fast enough that the heat affected zone could be quench hardened. Metallurgical properties can be engineered and thus tailored with this sort of controlled heat deposition.

Local alloy composition adjustment: This would be a rework operation to adjust the parameters of an already built structure, such as a bridge or high rise building that had need of reengineering.

Mining: Mining could benefit by being able to cut slots in the face of a hard rock mountain. A 1 million watt laser can vaporize a 1 inch hole though 10 ft. of rock a second. A method of using this ability would be to cut horizontal blocks from the rock face and have them fall onto a conveyor belt on an articulated arm. If a vertical slot is cut or applied at 2 foot intervals placed vertically side by side, with the additional assistance of an articulated arm-conveyor belt, and with the said arm placed under a vertical finger, a square block could be cut from the face by applying a second horizontal cut across the face of vertical slabs. The operational principle would be to use the block's weight, to break off the protruding finger block, which would be planned to "fall" onto the conveyor belt.

By this method a 10 meter by 10 meter by 1-2 meter section of hard rock face could be removed semi automatically by this combination machine. By comparison a team of miners working in the South African Gold mines would remove a 5 meter by 5 meter by 1 meter panel in 24 hours. This describes a method of using the said invention to increase mining operations by 4 times per hour and then 24 times per day to yield 96 time increase in mining rate. This would represent a labor reduction and or rate increase by this amount. Additionally there is no reason that output power could not be increased to any desired power level.

Pulsed Laser IFM Applications

If slab, rod, fiber or diode laser amplifiers are employed utilizing an IFM system, then by placing a mirror at the end of each amplifier chain (which can be a single fiber or diode laser element or any chosen gain element) a single short seed pulse will enter the arm or chain of amplifiers and will be redirected back to the entry point, propagate to the feedback mirror via the main mirror element, with the larger portion of energy being transmitted through the feedback mirror such that the individual arms of beamlets will be combined in amplitude, but not necessarily homogenized at that point until or unless desired. Further, by having determined and implemented, an architecture such that the propagation time through each arm of amplifier chains is identical to the others in the array. Then, by injecting a seed pulse which is synchronously entering each arm, then having in each amplifier chain a very short pulse will be accommodated and amplified and returned synchronously into the feedback mirror which is also transmitting a larger portion of the now amplified and amplitude added beamlets.

In the case where ultrashort pulses are to be amplified, then frequency dispersion correcting elements can be periodically added to each arm. This method will permit the generation of not just one but a repetitive series of sequentially launched pulses into a multi-megawatt ultrafast laser system.

Applications for this type of laser energy include:
1) Very high speed pulsed laser deposition;
2) Very high speed plasma deposition into a mold in a vacuum chamber;
3) Very high speed plasma deposition;
4) Very high speed cutting of material;
5) Very high speed cutting with ultrashort pulses so as to leave no edge effect or heat deposition;
6) Heatless machining of shape charge explosives;
7) Direct integrated circuit manufacture;

8) Utilizing the high power ultra fast energy beam as a source for hybrid laser based molecular beam epitaxy machines the ion beam current can be increased by orders of magnitude thus reducing part cost in high finesse micro electronic device manufacture;
9) Very high pulse energy power, high average power ultra fast beams would also be an enabling technology for particle beam acceleration; and
10) Very high pulse energy, high repetition rate laser power would be an enabling technology for Fusion reactors.

Combined Beam IFM applications:

This approach permits the combining of ultra fast and high average power q switched and or continuous beams irradiating the same target, through the same beam delivery optics system. In this application it is assumed all laser systems are using the described IFM concept but are parallel systems, and would be fabricated with a beam combiner optical system. In concept and reality, the two or more beams can be multiplexed by virtue of being individually polarized, which permits polarization combining of two separate beams of identical frequency but with polarization vectors at right angles to each other. Additionally, separate laser systems operating on alternate different frequencies can be similarly combined. In this application a q switched amplifier chain would be combined with a continuous beam system such that both beams were incident on the target at the same time through the same beam delivery system. If this concept is applied to mining or cutting, then a much higher rate of throughput is achieved due to the continuous beam adding heat energy to the matrix of the rock being cut, or material being processed—between discrete pulses, with the pulsed laser delivering just the vaporizing energy.

Table 1, provided below, lists a number of laser types that can be used with the disclosed embodiments. The list showcases combinations of device types and operating modes (CW/Pulsed/Hybrid) with suggested architectures with some applications related combinations:

TABLE 1

| Laser Type & Combination | Application | With High Finesse Adaptive Optics + Fast Beam Director |
| --- | --- | --- |
| CW Diode IFM<br>CW Fiber IFM | High Speed Thick Section Welding | Laser Launch or General Tactical Weapon |
| CW Diode IFM +<br>Pulsed Diode IFM | Welding - Heat Treating - Surface Alloying Cutting - Excavating - Drilling - Tunneling | Tactical Weapon - Anti Missile System |
| CW Fiber IFM +<br>Pulsed Fiber IFM | Welding - Heat Treating - Surface Alloying Cutting - Excavating - Drilling - Tunneling | Tactical Weapon - Anti Missile System |
| CW Diode IFM +<br>Pulsed Slab IFM | Combination best for Metal Cutting | Hybrid High Speed Molecular Beam Epitaxy |
| CW Fiber IFM +<br>Pulsed Slab IFM | Combination best for Metal Cutting | Hybrid High Speed Molecular Beam Epitaxy |
| Q Switched Slab IFM<br>Ultra Fast Slab IFM | Combination best for Pulsed Laser Deposition High Speed Thin Film Deposition - HS Direct Laser Mfg. Ultra High Temp Bulk Composite Transfer Part Fab with Holographic Master Digital Measurement Reference | Ultra High Speed Microstructure Device Manufacture - Integrated Circuit - Integrated Optic Circuit Device - With Frequency Doubling - High Volume Isotope Separation - Space Based Element Refining |

The invention has been described hereinabove using specific examples and embodiments; however, it will be understood by those skilled in the art that various alternatives may be used and equivalents may be substituted for elements and/or steps described herein, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A device for generating a focused laser beam, said device comprising:
    an emitter arranged to produce a plurality of beamlets;
    a first concave reflecting mirror for converging said beamlets to a focal point;
    an integrating convex mirror placed at or near said focal point, said integrated convex mirror adapted for reflecting a first portion of said beamlets back toward said first reflecting mirror and for allowing a second portion of said beamlets through said integrating convex mirror; and
    a light transmitter adapted for transmitting said second portion of said beamlets from said integrating convex mirror, wherein said second portion of beamlets exit said light transmitter as a laser beam.

2. The device of claim 1, wherein said emitter is comprised of a plurality of fibers for transmitting said beamlets.

3. The device of claim 1, wherein said emitter is comprised of at least one slab laser.

4. A system comprising a plurality of the devices of claim 1 chained together using adaptive optics or a beam combiner or both.

5. The device of claim 1, wherein said light transmitter is comprised of a fluid-filled tube, a hollow tube, a plurality of fibers for transmitting individual beamlets, and a rod of glass which has been treated with silver nitrate to form a gradient index light conduit.

6. The device of claim 1, wherein said light transmitter is comprised of a fluid-filled tube.

7. The device of claim 1, wherein said light transmitter is comprised of a hollow tube.

8. The device of claim 1, wherein said light transmitter is comprised of a plurality of fibers for transmitting individual beamlets.

9. The device of claim 1, wherein said light transmitter is comprised of a rod of glass which has been treated with silver nitrate to form a gradient index light conduit.

10. The device of claim 1, wherein said device is adapted for generating a short pulse of one picosecond or less.

11. The device of claim 1, wherein said emitter is comprised of one or more diode lasers.

12. A device for generating a focused laser beam, said device comprising:
    an emitter arranged to produce a plurality of beamlets;
    a seed laser;
    a first concave reflecting mirror for converging said beamlets to a focal point;
    an integrating convex mirror placed at or near said focal point, said integrated convex mirror adapted for reflecting a first portion of said beamlets back toward said first reflecting mirror and for allowing a second portion of said beamlets through said integrating convex mirror; and
    a light transmitter adapted for transmitting said second portion of said beamlets from said integrating convex mirror, wherein said second portion of beamlets exit said light transmitter as a uniform laser beam, wherein said seed laser is activated to form said focused laser beam.

13. The device of claim 12, wherein said seed laser is a Littman-Metcalf extended cavity diode laser.

14. The device of claim 12, wherein said emitter is comprised of a plurality of fibers for transmitting said beamlets.

15. The device of claim 12, wherein said emitter is comprised of at least one slab laser.

16. A system comprising a plurality of the devices of claim 12 chained together using adaptive optics or a beam combiner or both.

17. The device of claim 12, wherein said emitter is comprised of one or more diode lasers.

18. A device for generating a focused laser beam, said device comprising:
   an emitter arranged to produce a plurality of beamlets;
   a seed laser including an extended cavity diode that is activated separately from said emitter, said seed laser for emitting a beam used for generating the laser beam;
   a concave mirror placed at a designated distance in front of the array to receive the beamlets for reflecting and converging the beamlets;
   a convex optical mirror which is partially reflective for intercepting the reflected and converged beamlets from said concave mirror with the convex surface of the convex optical mirror reflecting at least a portion of the converging array of beamlets back to the concave mirror, wherein
   another portion of the converging array of beamlets are transmitted through the convex mirror for emitting the laser beam.

19. The device of claim 18, wherein said device is adapted for generating a short pulse of one picosecond or less by activating said seed laser with said main laser diode array.

20. The device of claim 18, wherein said seed laser is activated to form said focused laser beam.

21. The device of claim 18, wherein said emitter is comprised of one or more diode lasers.

* * * * *